US012163224B2

(12) United States Patent
Lei et al.

(10) Patent No.: US 12,163,224 B2
(45) Date of Patent: Dec. 10, 2024

(54) METHODS FOR DEPOSITING A CONFORMAL METAL OR METALLOID SILICON NITRIDE FILM

(71) Applicants: VERSUM MATERIALS US, LLC, Tempe, AZ (US); BOARD OF REGENTS, THE UNIVERSITY OF TEXAS SYSTEM, Austin, TX (US)

(72) Inventors: Xinjian Lei, Carlsbad, CA (US); Moo-Sung Kim, Ansan-Si (KR); Anupama Mallikarjunan, Carlsbad, CA (US); Aaron Michael Dangerfield, Plano, TX (US); Luis Fabián Peña, Richardson, TX (US); Yves Jean Chabal, Richardson, TX (US)

(73) Assignees: VERSUM MATERIALS US, LLC, Tempe, AZ (US); BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 15/764,751

(22) PCT Filed: Oct. 6, 2016

(86) PCT No.: PCT/US2016/055737
§ 371 (c)(1),
(2) Date: Mar. 29, 2018

(87) PCT Pub. No.: WO2017/062614
PCT Pub. Date: Apr. 13, 2017

(65) Prior Publication Data
US 2018/0274097 A1      Sep. 27, 2018

Related U.S. Application Data

(60) Provisional application No. 62/237,899, filed on Oct. 6, 2015.

(51) Int. Cl.
C23C 16/34      (2006.01)
C23C 16/30      (2006.01)
C23C 16/455     (2006.01)

(52) U.S. Cl.
CPC ...... *C23C 16/45553* (2013.01); *C23C 16/303* (2013.01); *C23C 16/345* (2013.01); *C23C 16/45531* (2013.01)

(58) Field of Classification Search
None
See application file for complete search history.

(56) References Cited

U.S. PATENT DOCUMENTS

| 3,974,003 | A | 8/1976 | Zirinsky et al. | |
| 7,678,422 | B2 * | 3/2010 | Lei | C23C 16/34 |
| | | | | 117/88 |
| 8,791,034 | B2 * | 7/2014 | Shealy | H01L 21/02145 |
| | | | | 438/791 |
| 2002/0068466 | A1 * | 6/2002 | Lee | C23C 16/409 |
| | | | | 438/778 |
| 2004/0009336 | A1 * | 1/2004 | Marcadal | H01L 21/76843 |
| | | | | 257/E21.171 |
| 2005/0287747 | A1 | 12/2005 | Chakravarti et al. | |
| 2006/0138566 | A1 | 6/2006 | Chakravarti et al. | |
| 2006/0182885 | A1 * | 8/2006 | Lei | H01L 21/02205 |
| | | | | 257/E21.171 |
| 2008/0145535 | A1 * | 6/2008 | Lei | C23C 16/34 |
| | | | | 427/255.18 |
| 2008/0242077 | A1 * | 10/2008 | Clark | H01L 29/4941 |
| | | | | 438/618 |
| 2008/0317972 | A1 * | 12/2008 | Hendriks | C23C 16/18 |
| | | | | 427/569 |
| 2008/0318443 | A1 * | 12/2008 | Kim | C23C 16/45553 |
| | | | | 438/785 |
| 2012/0128897 | A1 * | 5/2012 | Xiao | C23C 16/345 |
| | | | | 548/406 |

(Continued)

FOREIGN PATENT DOCUMENTS

| EP | 2009139 | 12/2008 |
| EP | 2669248 | 12/2013 |

(Continued)

OTHER PUBLICATIONS

International Search Report and Written Opinion mailed Jan. 12, 2017 for counterpart international patent application No. PCT/US2016/055737 by the European Patent Office in its capacity as International Searching Authority.

*Primary Examiner* — David P Turocy
(74) *Attorney, Agent, or Firm* — Daniel C. Roth

(57) ABSTRACT

Described herein are methods for forming a conformal Group 4, 5, 6, 13 metal or metalloid doped silicon nitride film. In one aspect, there is provided a method of forming an aluminum silicon nitride film comprising the steps of: providing a substrate in a reactor; introducing into the reactor an at least one aluminum precursor which reacts on at least a portion of the surface of the substrate to provide a chemisorbed layer; purging the reactor with a purge gas; introducing into the reactor an organoaminosilane precursors to react on at least a portion of the surface of the substrate to provide a chemisorbed layer; introducing a nitrogen source and an inert gas into the reactor to react with at least a portion of the chemisorbed layer; and optionally purge the reactor with an inert gas; and wherein the steps are repeated until a desired thickness of the aluminum nitride film is obtained.

5 Claims, 3 Drawing Sheets

(56) References Cited

U.S. PATENT DOCUMENTS

| | | |
|---|---|---|
| 2013/0078376 A1 | 3/2013 | Higashino et al. |
| 2013/0181240 A1 | 7/2013 | Chen et al. |
| 2013/0196080 A1* | 8/2013 | Cho .................. H01J 37/32082 427/569 |
| 2015/0194298 A1 | 7/2015 | Lei et al. |
| 2015/0221495 A1 | 8/2015 | Takasawa et al. |

FOREIGN PATENT DOCUMENTS

| | | | |
|---|---|---|---|
| JP | 2011044493 A | * | 3/2011 |
| KR | 20110056461 A | | 5/2011 |

* cited by examiner

METHODS FOR DEPOSITING A CONFORMAL METAL OR METALLOID SILICON NITRIDE FILM

CROSS-REFERENCE TO RELATED APPLICATIONS

This Application claims the benefit of Application No. 62/237,899, filed on Oct. 6, 2015. The disclosure of Application No. 62/237,899 is hereby incorporated by reference.

BACKGROUND OF THE INVENTION

Various publications, including patents and patent applications are cited throughout the specification. Each of these cited publications is incorporated by reference herein, in its entirety and for all purposes.

Described herein is a method for depositing a stoichiometric or non-stoichiometric silicon nitride film that is doped with a Group 4, 5, 6, 13 of the Periodic Table metal or metalloid using one or more Group 4, 5, 6, 13 metal or metalloid precursors. More specifically, described herein are thermal based, cyclic methods including, but not limited to, thermal atomic layer deposition ("ALD"), thermal cyclic chemical vapor deposition ("CVD") methods that are used for depositing the Group 4, 5, 6, 13 doped metal or metalloid films such as aluminum, gallium, indium, thallium, boron, or combinations thereof silicon nitride films that can be used, for example, in the fabrication of integrated circuit devices.

Because of its combination of unique properties, Group 4, 5, 6, 13 containing metal or metalloid films such as, without limitation, aluminum nitride (AlN) or boron nitride (BN) films can be used for a variety of electronic applications. The prior art provides different methods for preparing and using Group 4, 5, 6, 13 doped metal or metalloid films such as AlSiN films. For example, U.S. Pat. No. 3,974,003, discloses a chemical vapor deposition (CVD) method for depositing a layer containing. Al, N, and which comprises providing a substrate to be coated, a carrier gas, and a gaseous mixture of nitrogen source compounds, aluminum source compounds, and silicon source material and heating the substrate to a temperature in the range of about 500-1300° to cause formation of the layer containing Al, N, and Si. The reactants, $NH_3$, $AlCl_3$, and $SiH_4$, can be used.

US Publ. No. 2015/0221495 discloses a cyclic deposition process for forming a film comprising: forming a first layer including a first element on a substrate by supplying a gas containing the first element; forming a second layer including first and second elements by supplying a gas containing the second element to modify the first layer; and forming a thin film having a predetermined thickness by setting the forming of the first layer and the forming of the second layer to one cycle and repeating the cycle at least once.

U.S. Pat. No. 8,791,034 discloses a CVD method for forming an aluminum-silicon nitride layer upon a substrate uses an aluminum precursor, a silicon precursor and a nitrogen precursor under CVD conditions to deposit the aluminum-silicon nitride layer upon the substrate.

Accordingly, there is a need in the art to provide a low temperature (e.g., processing temperature of about 500° C. or less) method for depositing a conformal, high quality, Group 4, 5, 6, 13 element doped such as without limitation, an aluminum-doped silicon nitride or an aluminum-doped silicon carbonitride film wherein the film has one or more of the following characteristics: a density of 2.0 grams per cubic centimeter (g/cc) or greater, a low wet etch rate (as measured in dilute hydrofluoric acid (HF)), hydrogen content less than 20 atomic weight percent %, a reflective index of 1.80 or greater, and combinations thereof.

BRIEF SUMMARY OF THE INVENTION

Figure 1:
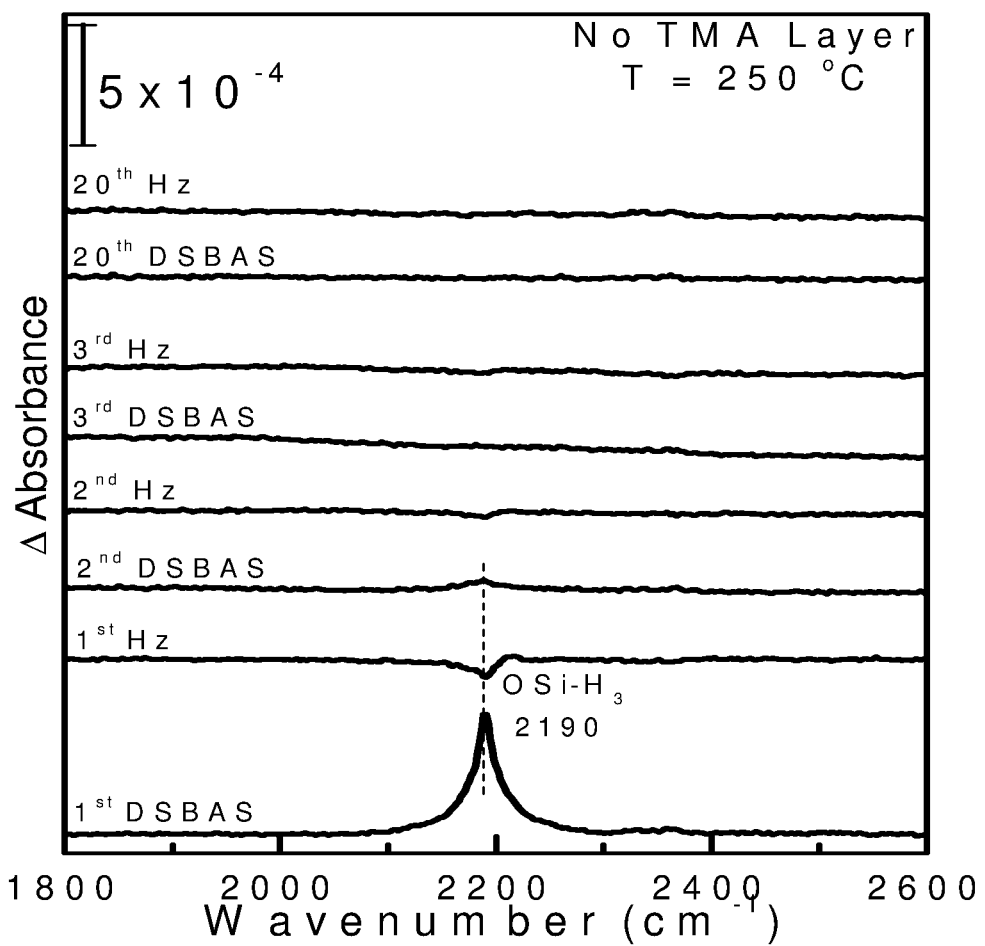
FIG. 1 shows differential FT-IR spectra during the $1^{st}$, $2^{nd}$, $3^{rd}$, and $20^{th}$ DSBAS and $N_2H_4$ ALD cycles.

Described herein are methods for forming stoichiometric or non-stoichiometric Group 4, 5, 6, 13 metal or metalloid doped silicon nitride films, such as aluminum, gallium, indium, thallium, boron, or combinations thereof doped, silicon nitride films onto at least a portion of a substrate. More specifically, described herein is an atomic layer deposition (ALD) or cyclic CVD method for depositing an aluminum-doped silicon nitride or aluminum-doped silicon carbonitride film.

In one aspect, there is provided a method for depositing an aluminum doped silicon nitride film, the method comprising the steps of:
a. providing a substrate into a reactor;
b. introducing into the reactor an aluminum precursor selected from the group consisting of $AlCl_3$, trimethylaluminum (TMA), triethylaluminum, tris(dimethylamino)aluminum (TDMAA), tris(dimethylamino)aluminum (TDMAA), and tris(diethylamino)aluminum (TDEAA) under process conditions sufficient to react the aluminum precursor and provide a chemisorbed layer;
c. purge to remove unreacted aluminum precursor;
d. introducing into the reactor a nitrogen source to react with at least a portion of the chemisorbed layer;
e. purging the reactor with a purge gas;
f. introducing into the reactor an organoaminosilane precursor represented by the following Formulae I through IV below:

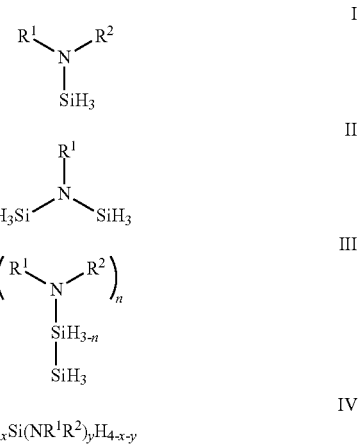

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, a $C_6$ to $C_{10}$ aryl group, a $C_1$ to $C_{10}$ alkyl silyl group, and a silyl group; $R^2$ is selected from hydrogen, a linear $C_2$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, and a $C_4$ to $C_{10}$ aryl group; n=1 or 2; x=0, 1, 2; y=2, 3; and optionally wherein $R^1$ and $R^2$ in Formulae I, III and IV are linked together to form a ring selected from a substituted or unsubstituted aromatic ring or a substituted or unsubstituted aliphatic ring, wherein the organoaminosilane precursor reacts on at least a portion of the surface of the substrate to provide a chemisorbed layer;
  g. purging the reactor with a purge gas;
  h. introducing a nitrogen source into the reactor to react with at least a portion of the chemisorbed layer; and;
  i. optionally purge the reactor with an inert gas; and wherein the steps b through i are repeated until a desired thickness of the film is obtained. In certain embodiments of Formulae I, III, and IV, $R^1$ and $R^2$ are the same. In other embodiments of Formulae I, III and III, $R^1$ and $R^2$ are different. In the foregoing or other embodiments of Formula I and IV, $R^1$ and $R^2$ can be linked together to form a ring. In these embodiments, the ring can be a substituted or an unsubstituted aromatic or aliphatic ring. In the yet further embodiments, $R^1$ and $R^2$ are not linked together to form a ring.

In one embodiment, described herein is an atomic layer deposition (ALD) or ALD-like method for depositing a Group 4, 5, 6, 13 metal or metalloid silicon nitride or carbonitride film at a low temperature, or one or more deposition temperatures ranging from about 25° C. to about 500° C., using a Group 4, 5, 6, 13 metal or metalloid precursor and organoaminosilane precursor having Formulae I through IV described herein in a thermal process which comprises nitrogen-containing source.

DETAILED DESCRIPTION OF THE INVENTION

The deposition of conformal, stoichiometric or non-stoichiometric Group 4, 5, 6, 13 metal or metalloid doped silicon nitride or silicon carbonitride dielectric films such as, without limitation, aluminum or boron or gallium doped silicon nitride films, at low temperature, e.g., temperatures of 500° C. or less, about 200° C. to about 400° C. and in some cases about 250° C. to about 450° C., which meet one or more criteria to be considered a high quality film, has been a long-standing industry challenge. An aluminum doped silicon nitride film is considered a "high quality" film if it has one or more of the following characteristics: a density of 2.2 grams per cubic centimeter (g/cc) or greater (e.g., about 2.2 to about 3.0 g/cc, about 2.4 to about 2.9 g/cc and in some cases about 2.4 to about 2.8 g/cc) as measured by X-ray-reflectometry (XRR), a low wet etch rate (as measured in dilute hydrofluoric acid (0.5 wt % HF in DI water), a hydrogen content of 20 atomic (at.)% or less (e.g., about 1 at. % to about 20 at. %, about 5 at. % to about 20 at. % and in some cases about 1 at % to about 10 at. %) as measured by secondary ion mass spectrometry (SIMS), a reflective index greater of 1.80 or greater (e.g., about 1.8 to about 2.8, about 2.0 to about 2.6 and in some cases about 2.2 to about 2.4), a low leakage current of 1E-7 A/$cm^2$ or lower (e.g., about 1E-8 A/$cm^2$ to about 9E-7 A/$cm^2$, about 1E-8 A/$cm^2$ to about 1E-9 A/$cm^2$ and in some cases about 1E-7 A/$cm^2$ to about 1E-9 A/$cm^2$) as measured by mercury probe, a high breakdown voltage of 6 MV/cm or higher (e.g., about 6 MV/cm to about 10 MV/cm, about 6 MV/cm to about 8 MV/cm and in some cases about 7 MV/cm to about 9 MV/cm) as measured by mercury probe, and combinations thereof.

Described herein are methods for forming stoichiometric or non-stoichiometric Group 4, 5, 6, 13 doped silicon nitride films such as aluminum doped silicon nitride, boron doped silicon nitride, gallium doped silicon nitride, indium doped silicon nitride, thallium doped nitride and combinations thereof onto at least a portion of a substrate.

Also described herein are methods for forming a stoichiometric or non-stoichiometric aluminum doped silicon nitride film comprising silicon and nitrogen onto at least a portion of a substrate. In certain embodiments, the aluminum doped silicon nitride film further comprises carbon or aluminum such as a silicon carbonitride or silicon aluminum nitride film. In certain embodiments, the aluminum doped silicon nitride film further comprises oxygen such as a silicon oxynitride film. In this or other embodiments, the aluminum doped silicon nitride film comprises oxygen and carbon such as a silicon carboxynitride film. Throughout the description, the term "aluminum doped silicon nitride" as used herein refers to a film comprising aluminum, silicon and nitrogen selected from the group consisting of stoichiometric or non-stoichiometric aluminum silicon nitride, aluminum silicon carbonitride, aluminum silicon carboxynitride, and there mixture thereof.

As previously mentioned, the films are deposited using a Group 4, 5, 6, 13 metal or metalloid precursor such as an aluminum precursor and an organoaminosilane which is at least one represented by the following Formulae I through IV below:

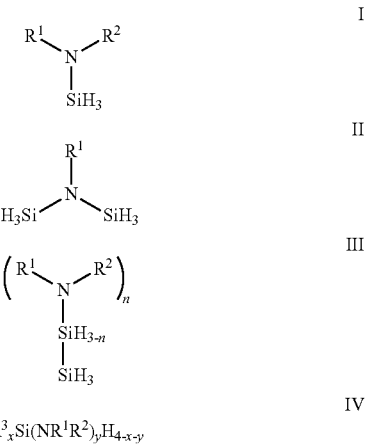

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, a $C_6$ to $C_{10}$ aryl group, a $C_1$ to $C_{10}$ alkyl silyl group, and a silyl group; $R^2$ is selected from hydrogen, a linear $C_2$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, and a $C_4$ to $C_{10}$ aryl group; n=1 or 2; x=0, 1, 2; y=2, 3; and optionally wherein $R^1$ and $R^2$ in Formulae I, III and IV are linked together to form a ring selected from a substituted or unsubstituted aromatic ring or a substituted or unsubstituted aliphatic ring. In Formula IV, x and y are such that the sum of x+y is less than or equal to 4 (including 0) but cannot be a negative integer. Exemplary organoaminosilanes having formulae I, II, III, and IV include, but not limited to, di-iso-propylaminosilane, di-sec-butylaminosilane, phenylmethylaminosilane, 2,6-dimethylpiperidinosilane, N-methylcyclohexylaminosilane, N-ethylcyclohexylaminosilane, N-isopropylcyclohexylaminosilane, 2-methylpiperidinosilane, N-silyldecahydroquinoline, 2,2,6,6-tetramethylpiperidinosilane, 2-(N-silylmethylamino)pyridine, N-t-butyldisilazane, N-t-pentyldisilazane, N-(3-methyl-2-pyridyl)disilazane, N-(2-methylphenyl)disilazane, N-(2-ethylphenyl)disilazane, N-(2,4,6-trimethylphenyl)disilazane, N-(2,6-di-iso-pripylphenyl)disilazane, di-iso-propylaminodisilane, di-iso-butylaminodisilane, di-sec-butylaminodisilane, 2,6-dimethylpiperidinosilane, N-methylcyclohexylaminodisilane, N-ethylcyclohexylaminodisilane, phenylmethylaminodisilane, 2-(N-disilylmethylamino)pyridine, N-phenylethyldisilane, N-isopropylcyclohexylaminodisilane, 1,1-(N,N'-di-tert-butylethylenediamino)disilane, bis(iso-propylamino)methylsilane, bis(iso-butylamino)methylsilane, bis(sec-butylamino)methylsilane, bis(tert-butylamino)methylsilane, bis(tert-pentylamino)methylsilane, bis(cyclohexylamino)methylsilane, bis(iso-propylamino)dimethylsilane, bis(iso-butylamino)dimethylsilane, bis(sec-butylamino)dimethylsilane, bis(tert-butylamino)dimethylsilane, bis(tert-pentylamino)dimethylsilane, and bis(cyclohexylamino)dimethylsilane, bis(dimethylamino)silane, bis(diethylamino)silane, bis(ethylmethylamino)silane, bis(tert-butylamino)silane, tris(dimethylamino)silane, tris(iso-propylamino)silane, trisilylamine (TSA), and TSA derivatives.

The organoaminosilane precursors having Formulae I, II, III, and IV described herein exhibit a balance of reactivity and stability that makes them ideally suited as PEALD or PECCVD precursors for semiconductor device manufacturing processes. With regard to reactivity, certain precursors may have boiling points that are too high to be vaporized and delivered to the reactor to be deposited as a film on a substrate. Precursors having higher relative boiling points require that the delivery container and lines need to be heated at or above the boiling point of the precursor under a given vacuum to prevent condensation or particles from forming in the container, lines, or both. Importantly, the organoaminosilane precursors having Formula I, II, III or IV have more Si—H groups than those disclosed in prior art, potentially allowing the deposition of high quality aluminum doped silicon nitride via reacting Si—H with Si—NH catalyzed by adsorbed aluminum precursor to form Si—N—Si linkage. In certain embodiments, the organoaminosilane precursors of Formula IV having Si—NH group such as bis(tert-butylamino)silane (BTBAS) or bis(sec-butylamino)methylsilane or bis(iso-propylamino)methylsilane may react with adsorbed Al-Me groups to form Al—N—Si bond, then allowing more silicon fragments be anchored on structured substrates and promoting formation of highly conformal aluminum doped silicon nitride or silicon carbonitride. In certain embodiments, the organoaminosilane precursors having Formula I to IV described herein comprise 2% or less by weight, or 1% or less by weight, or 0.5% or less by weight of by-product (after being stored for a time period of 6 months or greater, or one year or greater which is indicative of being shelf stable. In addition to the foregoing advantages, in certain embodiments, such as for depositing an aluminum doped silicon nitride film using PEALD, or PECCVD deposition method, the organoaminosilane precursor described herein may be able to deposit high density materials at one or more deposition temperatures, e.g., 400° C. or less, 350° C. or less, 300° C. or less, or 250° C. or less, 200° C. or less, 150° C. or less, 100° C. or less, or 50° C. or less.

In the formulae herein and through the description, the term "alkyl" denotes a group derived from an alkane by removal of one hydrogen atom and having from 1 to 10 or from 3 to 6 or from 3 to 4 carbon atoms. Exemplary linear alkyl groups include, but are not limited to, methyl, ethyl, n-propyl, n-butyl, and n-pentyl. Exemplary branched alkyl groups include, but are not limited to, iso-propyl, tert-butyl, and sec-butyl.

In the formulae herein and throughout the description, the term "cyclic alkyl" denotes a cyclic functional group having from 3 to 10 or from 4 to 10 carbon atoms or from 5 to 10 carbon atoms. Exemplary cyclic alkyl groups include, but are not limited to, cyclobutyl, cyclopentyl, cyclohexyl, and cyclooctyl groups.

In the formulae herein and throughout the description, the term "aryl" denotes an aromatic cyclic functional group having from 5 to 12 carbon atoms or from 6 to 10 carbon atoms. Exemplary aryl groups include, but are not limited to, phenyl, benzyl, chlorobenzyl, tolyl, and o-xylyl.

In the formulae herein and throughout the description, the term "alkenyl group" denotes a group which has one or more carbon-carbon double bonds and has from 3 to 10 or from 3 to 6 or from 3 to 4 carbon atoms.

In the formulae herein and throughout the description, the term "alkynyl group" denotes a group which has one or more carbon-carbon triple bonds and has from 3 to 10 or from 3 to 6 or from 3 to 4 carbon atoms.

In the formulae herein and throughout the description, the term "dialkylamino group" denotes a group which has two alkyl groups attached to a nitrogen atom and has from 1 to 10 or from 2 to 6 or from 2 to 4 carbon atoms. Exemplary aryl groups include, but are not limited to dimethylamino, diethylamino, and ethylmethylamino.

In the formulae herein and throughout the description, the term "alkylsilyl group" denotes a group which has at least one silicon atom as well as 1 to 10 or from 2 to 6 or from 2 to 4 carbon atoms. Exemplary alkylsilyl groups include, but are not limited to, methylsilyl (MeSiH$_2$—), dimethylsilyl (Me$_2$SiH—), trimethylsilyl (Me$_3$Si—). The silyl group refers to H$_3$Si— or (H$_3$Si)$_2$NSiH$_2$—.

In the formulae herein and throughout the description, the term "electron withdrawing group" denotes an atom or group thereof that acts to draw electrons away from the M-N bond. Examples of suitable electron withdrawing groups or substituents include, but are not limited to, nitriles (CN). In certain embodiments, electron withdrawing substituent can be adjacent to or proximal to N in any one of the Formulae I through III. Further non-limiting examples of an electron withdrawing group includes F, Cl, Br, I, CN, NO$_2$, RSO, and/or RSO$_2$ wherein R can be a C$_1$ to C$_{10}$ alkyl group such as, but not limited to, a methyl group or another group.

In certain embodiments, one or more of the alkyl group, alkenyl group, alkynyl group, alkoxy group, dialkylamino group, aryl group, and/or electron withdrawing group in Formulae I through IV may be substituted or have one or more atoms or group of atoms substituted in place of, for example, a hydrogen atom. Exemplary substituents include, but are not limited to, oxygen, sulfur, halogen atoms (e.g., F, Cl, I, or Br), nitrogen, and phosphorous. For example, the term "fluorinated alkyl group" denotes a group wherein the alkyl group has one or more of its atoms such, as a hydrogen atom, substituted with a fluorine atom.

Throughout the description, the term "organoamine" as used herein describes organic compound has at least one nitrogen atom. Examples of organoamine, but are not limited to, methylamine, ethylamine, propylamine, iso-propylamine, tert-butylamine, sec-butylamine, tert-amylamine, ethylenediamine, dimethylamine, trimethylamine, diethylamine, pyrrole, 2,6-dimethylpiperidine, di-n-propylamine, di-iso-propylamine, ethylmethylamine, N-methylaniline, pyridine, and triethylamine. Similarly, throughout the description, the term "organoamino group" as used herein refers to an organic group consisting of at least one nitrogen atom derived from secondary or primary organoamines as described above. "Organoamino group" does not include —$NH_2$ group.

Throughout the description, the term "step coverage" as used herein is defined as a percentage of two thicknesses of the deposited aluminum doped silicon nitride film in a structured or featured substrate having either vias or trenches or both, with bottom step coverage being the ratio (in %): thickness at the bottom of the feature is divided by thickness at the top of the feature, and middle step coverage being the ratio (in %): thickness on a sidewall of the feature is divided by thickness at the top of the feature. Films deposited using the method described herein exhibit a step coverage of about 60% or greater, about 70% or greater, about 80% or greater, or about 90% or greater which indicates that the films are conformal.

The method also includes a Group 4, 5, 6, 13 metal or metalloid precursor. Exemplary Group 4, 5, 6, 13 metal or metalloid precursors include, but are not limited to, trimethylaluminum, triethylaluminum, tris(dimethylamino)aluminum, tris(ethylmethylamino)aluminum, alkylaluminum chlorides (for example methylaluminum chloride, DMACl), trimethylborane, triethylborane, tris(dimethylamino)borane, tris(ethylmethylamino)borane, and tris(diethylamino)borane. Further exemplary Group 13 metalloid precursors include a "borane organoamine complex". A "borane organoamine complex" denotes a stable and volatile borane complex formed by reacting borane or diborane with an organoamine. Exemplary organoamine borane complexes include, but are not limited to borane trimethylamine complex, borane triethylamine complex, dimethylamine borane, borane pyridine complex, borane morpholine complex, borane tert-butylamine complex, borane 4-methylmorpholine complex, borane N,N-diisopropylethylamine complex, borane ethylenediamine complex, 2-Methylpyridine borane complex.

In certain embodiments, the Group 13 metal comprises aluminum. In these embodiments, the precursor is an aluminum precursor selected from the group consisting of $AlCl_3$, trimethylaluminum (TMA), triethylaluminum, methylaluminum chloride, tris(dimethylamino)aluminum (TDMAA), tris(dimethylamino)aluminum (TDMAA), and tris(diethylamino)aluminum (TDEAA).

The method used to form Group 4, 5, 6, 13 metal or metalloid nitride films, such as without limitation, aluminum or boron nitride films or coatings, are deposition processes. Examples of suitable deposition processes for the method disclosed herein include, but are not limited to, plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the aluminum nitride film is deposited using an ALD process. In another embodiment, the aluminum nitride film is deposited using a CCVD process. In a further embodiment, the aluminum nitride film is deposited using a thermal CVD process. The term "reactor" as used herein, includes without limitation, reaction chamber or deposition chamber. The ALD-like process is defined herein as a cyclic CVD process that provides a high conformal aluminum nitride film on a substrate as shown by having at least one of the following: percentage of non-uniformity of about 5% or less as measured by ellipsometer, a deposition rate of 0.1 Å or greater per cycle, or a combination thereof.

In certain embodiments, the method disclosed herein avoids pre-reaction of the precursors by using PEALD or PECCVD methods that separate the precursors prior to and/or during the introduction to the reactor. In this connection, deposition techniques such as PEALD or PECCVD processes are used to deposit Group 13 metal or metalloid nitride film. In one embodiment, the film is deposited via a PEALD process by exposing the substrate surface alternatively to the one or more the aluminum nitride precursor, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases.

Depending upon the deposition method, in certain embodiments, the at least one Group 4, 5, 6, 13 metal or metalloid precursors may be introduced into the reactor at a predetermined molar volume, or from about 0.1 to about 1000 micromoles. In this or other embodiments, the at least one aluminum precursor may be introduced into the reactor for a predetermined time period. In certain embodiments, the time period ranges from about 0.001 to about 500 seconds.

In certain embodiments, the Group 4, 5, 6, 13 metal or metalloid nitride films comprise aluminum and nitrogen or boron and nitrogen. In these embodiments, the aluminum or boron nitride films deposited using the methods described herein are formed in the presence of nitrogen-containing source. A nitrogen-containing source may be introduced into the reactor in the form of at least one nitrogen-containing source and/or may be present incidentally in the other precursors used in the deposition process. Suitable nitrogen-containing source gases may include, for example, ammonia, hydrazine, monoalkylhydrazine, dialkylhydrazine, tert-butylamine, methylamine, ethylamine, ethylenediamine, and mixtures thereof. In certain embodiments, the nitrogen source is ammonia or a composition comprising hydrazine. In certain preferred embodiments, the nitrogen-containing source comprises hydrazine. The nitrogen-containing source gas can be introduced into the reactor at a flow rate ranging from about 1 to about 2000 standard cubic centimeters (sccm) or from about 1 to about 1000 sccm. The nitrogen-containing source gas can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source gas can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

In the method described herein, a nitrogen-containing source gas comprises a hydrazine containing gas such as, without limitation, hydrazine, hydrazine/hydrogen, hydrazine/argon, hydrazine/nitrogen, and hydrazine in a solvent, and optionally a noble gas or solvent. The hydrazine source gas is introduced into the reactor at a flow rate ranging from about 1 to about 2000 square cubic centimeters (sccm) or from about 1 to about 1000 sccm or more. The nitrogen-containing source can be introduced for a time that ranges from about 0.01 to about 100 seconds or more. In embodiments, the precursor pulse can have a pulse duration that is greater than 0.01 seconds, and the hydrazine vapors can have a pulse duration that is less than 0.01 seconds. The hydrazine vapors can be delivered using pure hydrazine mixed with a noble gas, or mixed with a solvent. The weight percentage of the noble gas in the composition containing both hydrazine and noble gas or solvent can vary from 1 wt % to 99% whereas the weight percentage of the noble gas in the composition containing both hydrazine and noble gas or solvent can also vary from 1 wt % to 99%. The noble gas for the composition comprising hydrazine can be selected from the group consisting of nitrogen, helium argon, and mixture thereof. The solvent for the composition comprising hydrazine can be selected from the group consisting of ether, tertiary amine, alkyl hydrocarbon, aromatic hydrocarbon, tertiary aminoether, and combinations thereof.

Not being bound by theory, it is believed the composition comprising hydrazine can help the formation of Group 4, 5, 6, 13 metal or metalloid films such as an aluminum nitride film having less hydrogen content as well as provide reactive sites such as Al-Me or Al—$NMe_2$ groups on at least a portion of the chemisorbed surface, especially sidewalls of a structured substrate allowing to anchor silicon containing fragments onto these reactive sites in subsequent deposition cycles, thus boosting the deposition of silicon nitride on the sidewall or bottom of vias or trenches and making step coverage of 60% or greater possible since it is very difficult to achieve such as step coverage.

The deposition methods described herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon (Ne), hydrogen ($H_2$), and mixtures thereof. In certain embodiments, the inert gas that is used as a purge gas comprises a noble gas. The term "noble gas" as used herein means those gases found in Group 18 of the Periodic Table and include, helium (He), neon (Ne), argon (Ar), Xenon (Xe), krypton (Kr), and mixtures thereof. In one particular embodiment, the noble gas used as a purge gas comprises argon. In this or other embodiments, the purge gas comprising Ar is supplied into the reactor at a flow rate ranging from about 10 to about 2000 sccm for about 0.1 to 1000 seconds, thereby purging the unreacted precursor material and any byproduct that may remain in the reactor.

The respective step of supplying the precursors, the nitrogen-containing source, and/or other precursors, source gases, and/or reagents may be performed by changing the time for supplying them to change the stoichiometric composition of the resulting film.

The Group 4, 5, 6, 13 metal or metalloid precursors, organoaminosilane having formulae I to IV, or both may be delivered to the reaction chamber such as a PEALD or PECCVD reactor either single wafer or batch in a variety of ways such as bubbling, vapor draw, or direct liquid injection (DLI). In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In certain embodiments, the gas lines connecting from the precursor canisters to the reaction chamber are heated to one or more temperatures depending upon the process requirements and the container of the aluminum precursor having the formulae I through IV described herein is kept at one or more temperatures for bubbling. In other embodiments, a solution comprising the at least one aluminum nitride precursor having the formula described herein is injected into a vaporizer kept at one or more temperatures for direct liquid injection.

A flow of argon and/or other inert gas may be employed as a carrier gas to help deliver the vapor of the at least one aluminum precursor to the reaction chamber during the precursor pulsing. In certain embodiments, the reaction chamber process pressure is about 2 Torr or less. In other embodiments, the reaction chamber process pressure is about 10 Torr or less.

In one aspect, there is provided a method for depositing an aluminum doped silicon nitride film, the method comprising the steps of:

Yet, in another aspect, there is provided a method for depositing a conformal metal doped silicon nitride dielectric film via thermal atomic layer deposition at temperature below 500° C., the method comprising the steps of:
 a. providing a substrate into a reactor;
 b. introducing into the reactor a metal precursor under process conditions sufficient to react the metal precursor and provide a chemisorbed layer;
 c. purge to remove unreacted metal precursor;
 d. introducing into the reactor a nitrogen source to react with at least a portion of the chemisorbed layer and provide at least one reactive site;
 e. purging the reactor with a purge gas;
 f. introducing into the reactor an organoaminosilane precursor represented by the following Formulae I through IV below.

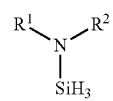

I

-continued

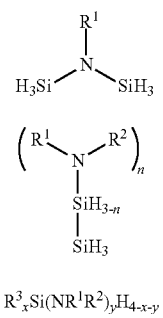

$$R^3{}_x Si(NR^1R^2)_y H_{4-x-y} \quad \text{IV}$$

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, a $C_6$ to $C_{10}$ aryl group, a $C_1$ to $C_{10}$ alkyl silyl group, and a silyl group; $R^2$ is selected from hydrogen, a linear $C_2$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, and a $C_4$ to $C_{10}$ aryl group; n=1 or 2; x=0, 1, 2; y=2, 3; and optionally wherein $R^1$ and $R^2$ in Formulae I, III and IV are linked together to form a ring selected from a substituted or unsubstituted aromatic ring or a substituted or unsubstituted aliphatic ring, wherein the organoaminosilane precursor reacts on at least a portion of the surface of the substrate to provide a chemisorbed layer;
  g. purging the reactor with a purge gas;
  h. introducing a nitrogen source into the reactor to react with at least a portion of the chemisorbed layer and provide at least one reactive site; and;
  i. optionally purge the reactor with an inert gas; and wherein the steps b through i are repeated until a desired thickness of the film is obtained. Suitable metal precursor can be selected from the group consisting of $AlCl_3$, trimethylaluminum (TMA), methylaluminum chloride, triethylaluminum, tris(dimethylamino)aluminum (TDMAA), tris(dimethylamino)aluminum (TDMAA), tris(diethylamino)aluminum (TDEAA), $ZrCl_4$, tetrakis(dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), and tetrakis(ethylmethylamino)hafnium (TEMAH), Titanium chloride ($TiCl_4$), tetrakis(dimethylamino)titanium (TDMAT), tetrakis(diethylamino)titanium (TDEAT), tetrakis(ethylmethylamino)titanium (TEMAT), tantalum chloride ($TaCl_5$), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylamino tri(dimethylamino)tantalum (TAIMAT), tert-amylamino tri(diethylamino)tantalum, pentakis(dimethylamino)tantalum, tert-amylamino tri(ethylmethylamino)tantalum, tungsten hexachloride, tungsten pentachloride, bis(tert-butylimino)bis(dimethylamino) tungsten (BTBMW), bis(tert-butylimino)bis(diethylamino)tungsten, bis(tert-butylimino)bis(ethylmethylamino)tungsten, and combinations thereof. Suitable nitrogen-source gases may include, for example, ammonia, hydrazine, monoalkylhydrazine such as 1-methylhydrazine, 1-tert-butylhydrazine, dialkylhydrazine such as 1,1-dimethylhydrazine, organoamine such as tert-butylamine, sec-butylamine, methylamine, ethylamine, iso-propylamine, ethylenediamine, and mixtures thereof. In other embodiments, the plasma can be inserted after step i to help densify the metal doped silicon nitride and the plasma is selected from the group consisting of hydrogen plasma, helium plasma, neon plasma, argon plasma, xenon plasma, hydrogen/helium plasma, hydrogen/argon plasma and mixtures thereof. In certain embodiments of the method described herein, steps b to i are repeated to provide the film with a thickness ranging from about 0.1 to about 500 Å, or from about 0.1 to about 5 Å, or from about 0.1 to about 10 Å, or about 0.1 to about 50 Å, or 0.1 to 100 Å. In some embodiment, steps b to e can be repeated many times before step f to i create a nanolaminate dielectric structure comprising an alternating metal nitride and silicon nitride with lower metal content (i.e. metal content is 10% or less bases XPS measurement). In some embodiments, a plasma comprising hydrogen selected from the group consisting of hydrogen plasma, hydrogen/helium, hydrogen/argon plasma, hydrogen/neon plasma and mixtures thereof can be inserted before step d or h to help removing hydrocarbon generated from the reaction between the metal precursor and the surface. In an alternative embodiment, the plasma comprises a non-hydrogen plasma.

The above steps define one cycle for the method described herein; and the cycle can be repeated until the desired thickness of the film is obtained. In this or other embodiments, it is understood that the steps of the methods described herein may be performed in a variety of orders, may be performed sequentially or concurrently (e.g., during at least a portion of another step), and any combination thereof. The respective step of supplying the precursors and nitrogen containing source may be performed by varying the duration of the time for supplying them to change the stoichiometric composition of the resulting nitride film, although always using nitrogen in less than a stoichiometric amount relative to the available Group 4, 5, 6, 13 metal or metalloid.

In certain embodiments, the resultant Group 4, 5, 6, 13 metal or metalloid doped silicon nitride films or coatings can be exposed to a post-deposition treatment such as, but not limited to, a plasma treatment, chemical treatment, ultraviolet light exposure, electron beam exposure, and/or other treatments to affect one or more properties of the film.

As mentioned previously, the method described herein may be used to deposit a Group 4, 5, 6, 13 metal or metalloid doped silicon nitride film on at least a portion of a substrate. Examples of suitable substrates include but are not limited to, silicon, germanium, silicon/germanium, $SiC_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, anti-reflective coatings, photoresists, a flexible substrate such as IGZO, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nano-electromechanical systems, thin film transistor (TFT), light emitting diodes (LED), organic light emitting diodes (OLED), IGZO, and liquid crystal displays (LCD).

The following examples illustrate the method for depositing Group 13 metal or metalloid doped silicon nitride films described herein and are not intended to limit it in any way.

EXAMPLES

In the following examples, unless stated otherwise, properties were obtained from sample films that were deposited onto medium resistivity (14-17 Ω-cm) single crystal silicon wafer substrates. All film depositions were performed using the CN-1 reactor which has a showerhead design. In typical process conditions, unless stated otherwise, the chamber pressure was fixed at a pressure ranging from about 1 to about 5 torr. Additional inert gas such as argon or nitrogen was used to maintain chamber pressure. The aluminum precursor and organoaminosilane precursor were delivered using vapor draw.

Comparable Example 1a. Thermal ALD Silicon Nitride Film Using Bis(Tert-Butylaminosilane (BTBAS) and Ammonia The silicon wafer was loaded into the CN-1 reactor equipped with showerhead design and heated to 350° C. with chamber pressure of 2 torr. Bis(tert-butylaminosilane (BTBAS) as organoaminosilane precursor and ammonia as nitrogen source. The ALD cycle was conducted using the following process parameters.
  a. Prepare the reactor and load wafer
    Chamber pressure: 2 torr
  b. Introduce organoaminosilane precursor to the reactor
    Total flow argon flow: 1000 sccm
    organoaminosilane precursor pulse: 2 seconds
  c. Purge
    Total flow of argon: 1000 sccm
    Purge time: 20 seconds
  d. Introduce nitrogen source
    Total flow of argon: 1000 sccm
    Flow of ammonia: 500 sccm for 10 seconds
  e. Purge
    Total flow of argon: 1000 sccm
    Purge time: 20 seconds.
Steps b to e are repeated for 1000 cycles, no detectable silicon nitride film was observed.

Example 1. Thermal ALD Aluminum Doped Silicon Nitride Film Using Tris(Dimethylamino)Aluminum, Bis(Tert-Butylaminosilane (BTBAS) and Ammonia The silicon wafer was loaded into the CN-1 reactor equipped with showerhead design and heated to 350° C. with chamber pressure of 2 torr. Trimethylaluminum (TMA) as aluminum precursor and bis(tert-butylaminosilane (BTBAS) as organoaminosilane precursor and ammonia as nitrogen source. The ALD cycle was conducted using the following process parameters.
  a. Prepare the reactor and load wafer
    Chamber pressure: 2 torr
  b. Introduce aluminum precursor to the reactor
    Total flow argon flow: 1000 sccm
    organoaminosilane precursor pulse: 2 seconds
  c. Purge
    Total flow of argon: 1000 sccm
    Purge time: 20 seconds
  d. Introduce nitrogen source
    Total flow of argon: 1000 sccm
    Flow of ammonia: 500 sccm for 5 seconds
  e. Purge
    Total flow of argon: 1000 sccm
    Purge time: 20 seconds.
  f. Introduce organoaminosilane precursor to the reactor
    Total flow argon flow: 1000 sccm
    organoaminosilane precursor pulse: 1 seconds
  g. Purge
    Total flow of argon: 1000 sccm
    Purge time: 10 seconds
  h. Introduce plasma
    Total flow of argon: 1000 sccm
    Flow of ammonia: 500 sccm for 10 seconds
  i. Purge
    Total flow of argon: 1000 sccm
    Purge time: 10 seconds.

In this experiment, one super cycle consisting of aluminum nitride having steps b to e are repeated once, followed by steps f to i for 20 times (i.e. a super cycle=(aluminum nitride: ($TMA/purge/NH_3/purge=2$ s/20 s/5/20 s)×1 cycle+ silicon nitride: ($BTBAS/purge/NH_3/purge=1.0$ s/10 s/10 s/10 s for 20 cycles). The super cycle is repeated 50 times (i.e. (aluminum nitride: ($TMA/purge/NH_3/purge=2$ s/20 s/5/20 s)×1 cycle+silicon nitride: ($BTBAS/purge/NH_3/purge=1.0$ s/10 s/10 s/10 s for 20 cycles))×50 cycles. TEM measurement showed the following thicknesses 250 Å corresponding to a silicon nitride growth rate of about 0.19 Å/cycle assuming 60 Å aluminum nitride, demonstrating deposited aluminum nitride boosts deposition of silicon nitride significantly.

Example 2. Thermal ALD Aluminum Doped Silicon Nitride Film Using Trimethylaluminum (TMA), Di-Sec-Butylaminosilane (DSBAS), and Hydrazine (Hz Double-side-polished, float-zone grown Si (111) substrates (lightly n doped, $\rho \sim 10$ Ωcm) were first cut to a size suitable for use in our home-built ALD tool. The substrates were first degreased in dichloromethane, acetone and methanol for 5 min. each. After degreasing, the substrate was rinsed thoroughly with water before being treated in a piranha solution (1:3 $H_2O_2/H_2SO_4$ mixture) for 30 min to produce an OH-terminated oxide surface. The sample was rinsed again with deionized water and blown dry with nitrogen ($N_2$) gas before immediate loading into the ALD reactor, with a base pressure of $10^{-4}$ Torr. The ALD process consisted of varying numbers of the following "supercycle": x(yTMA+z[DSBAS+$N_2H_4$]), where x is the total number of super-cycles, y is the number of TMA exposures during that super-cycle that occurred before $SiN_x$ growth, and z is the number of full ALD cycles of DSBAS and $N_2H_4$. The precursor exposure times were 1 s for TMA (p=390 mTorr), 3 s for DSBAS (p=440 mTorr) and 5 s for $N_2H_4$ (p=1.5 Torr). The DSBAS and $N_2H_4$ exposures also consisted of a 10 and 60 s containment step, respectively, where the valve to the pump is closed and the precursor remains in the ALD chamber for the aforementioned times. This step is taken to ensure maximum precursor-substrate interaction and also to conserve precursor, as the reactor volume is quite large. $N_2$ purges (1000 sccm, P=1.2 Torr) for 2.5 minutes occurred after each precursor exposure to stop any potential gas phase reactions and/or interference in the FT-IR measurements. The sample temperature is typically maintained between 250-300° C. during the ALD process.

Figure 2:
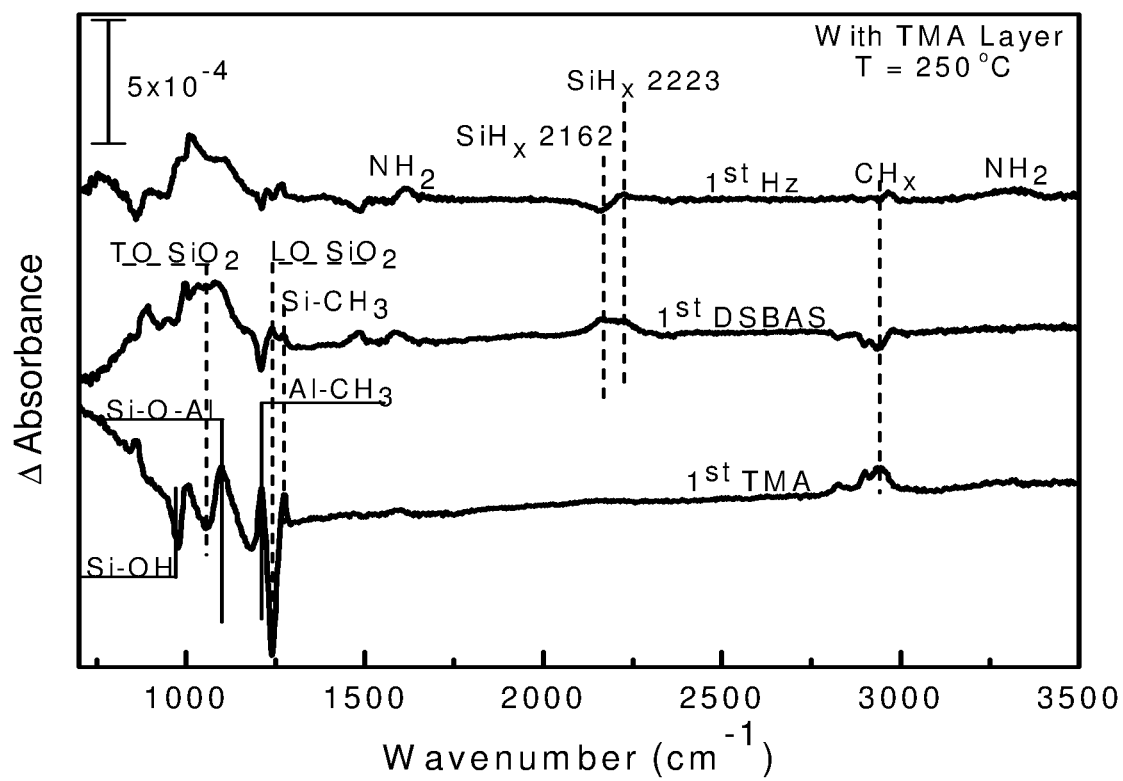
FIG. 2 shows FT-IR spectra showing reactivity between DSBAS and $N_2H_4$ after an initial exposure of TMA.
Figure 3:
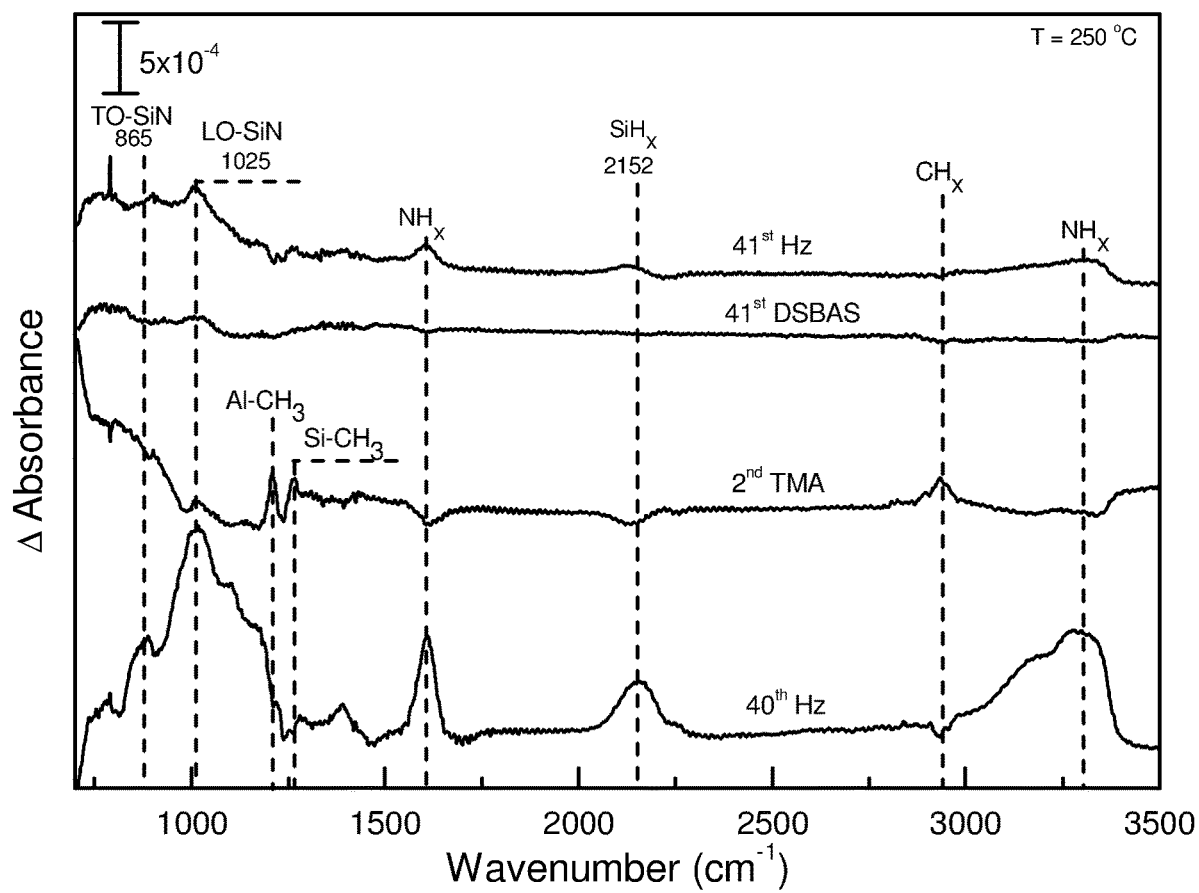
FIG. 3 shows FT-IR spectra of as deposited $SiN_x$ film after 40 cycles of DSBAS+$N_2H_4$ ($40^{th}$ Hz) and the effect of exposing the $SiN_x$ to TMA before continuing the $SiN_x$ growth.

FT-IR analysis is done with a Thermo Nicolet 6700 infrared spectrometer, equipped with a liquid-nitrogen cooled broadband mercury cadmium telluride (MCT-B) detector. A single-pass transmission at Brewster incidence (~74° to normal) is used to minimize substrate phonon absorption in the low frequency region (<1000 $cm^{-1}$) and increase sensitivity of all components (parallel and perpendicular to the surface) of surface species. A hydraulically controlled shield is positioned to protect the potassium bromide (KBr) windows from the precursor gases during ALD cycles. The sample is maintained at 100° C. for all IR measurements. To monitor the sample temperature during resistive heating, a K-type thermocouple is spot-welded onto a tantalum clip firmly attached at the center of the long edge of the Si substrate. X-ray photoelectron spectroscopy (XPS) was used to investigate the composition and the thickness of the $SiN_x$ films. XPS measurements were conducted by using an Al Kα (1486.6 eV) X-ray source at a chamber base pressure of $10^{-10}$ Torr, and spectra were recorded using a 16-channel detector with a hemispherical analyzer. Sputtering was performed using 1 kV $Ar^+$ ions supplied by an Ar sputter gun positioned at a 45° angle with respect to the substrate normal. Before exploring the film growth characteristics with the TMA catalytic layer, it was necessary to first probe the surface reactions that could occur between DSBAS and $N_2H_4$ alone. In this case, we used the above procedure to produce a clean, OH terminated surface. Before any precursor exposures could occur, the substrate was first annealed to 400° C. This is done to remove any contribution from thermally induced substrate changes in the subsequent FT-IR spectra. This step also isolates surface —OH groups, resulting in a well-defined peak ~3740 $cm^{-1}$, which eases IR interpretation for initial precursor adsorption. After the pre-annealing step, the substrate is sequentially exposed to DSBAS and $N_2H_4$ in a similar manner to the "super-cycle" previously mentioned, except with no TMA exposure. FIG. 1 shows differential FT-IR spectra at various points during the precursor exposures. The spectrum labeled "$1^{st}$ DSBAS" uses the pre-annealed substrate as the reference, while every other spectrum uses the spectrum from the previous process step as the reference. These differential spectra allow us to see the changes that occur on our surface after each precursor pulse, which can ultimately give insight into reaction mechanisms and surface saturation. In these spectra, positive peaks indicate a gain in surface species and negative peaks indicate a loss. The initial DSBAS exposure reacts with all of the surface —OH groups (loss at 3740 $cm^{-1}$, inset) and leaves Si—$H_3$ termination (gain at 2190 $cm^{-1}$). It is important to note that there is no evidence of the di-sec-butylamino ligand remaining attached, so it is believed to be completely purged away and to be non-reactive toward the surface once all —OH groups are consumed. After the initial $N_2H_4$ exposure ("$1^{st}$ Hz"), there is a slight perturbation at the Si—$H_3$ frequency, likely due to precursor physorption. Based on the FT-IR spectra taken after further DSBAS and $N_2H_4$ exposures, it is clear that no reaction occurs with the surface Si—$H_3$ groups, resulting in no actual film growth at 250° C. To confirm this lack of growth, XPS measurements were conducted on this sample. As can be seen in FIG. 2, TMA (black spectrum) readily chemisorbs on the —OH terminated surface. This is confirmed by the loss at 980 $cm^{-1}$ (bending mode of Si—OH), as well as a perturbation of the surface $SiO_2$, seen as a loss in the LO (1240 $cm^{-1}$) and TO (1063 $cm^{-1}$) phonon modes. Positive bands at 1206 $cm^{-1}$ (Al—$CH_3$), 1275 $cm^{-1}$ (Si—$CH_3$) and between 2800-3000 $cm^{-1}$ ($CH_3$ stretch modes) also confirm that TMA has attached to the surface. It is important to note that the Si—$CH_3$ band is the result of a methyl transfer from TMA to an underlying Si atom, and can cause carbon contamination within the bulk of the film. Upon DSBAS exposure (green spectrum), there is a loss in the $CH_3$ stretch and Al—$CH_3$ modes, followed by gains at 2162 and 2223 $cm^{-1}$, which are consistent with two forms of $SiH_x$. $N_2H_4$ (blue spectrum) reacts with the 2162 $cm^{-1}$ Sift component, leaving $NH_2$ termination (1602 and 3300 $cm^{-1}$ for scissor and stretch modes, respectively). Ligand exchange continues to occur between DSBAS and $N_2H_4$ for ~40 cycles. FIG. 3 shows the IR spectra after 40 cycles of DSBAS+$N_2H_4$ ($40^{th}$ Hz) which shows features consistent with $SiN_x$ growth. Most notably, the LO and TO phonon modes of $SiN_x$ are seen at 1025 and 865 $cm^{-1}$, respectively. It is also important to note that there is an appreciable amount of hydrogen incorporated into the film in the form of $SiH_x$ (2152 $cm^{-1}$) and $NH_x$ (1610, 3300 $cm^{-1}$). Upon TMA exposure ($2^{nd}$ TMA), there is loss in surface $SiH_x$ and $NH_x$ bands with gains in modes associated with Si—$CH_3$ and Al—$CH_3$, confirming TMA chemisorption on the nitride surface. The spectra labeled $41^{st}$ DSBAS and $41^{st}$ Hz show that DSBAS and $N_2H_4$ are able to react again, confirming the reinitiation of $SiN_x$ film growth.

The invention claimed is:

1. A method for depositing a conformal aluminum doped silicon nitride dielectric film via thermal atomic layer deposition, the method consisting of the following steps:
   a. providing a substrate into a reactor;
   b. introducing into the reactor an aluminum precursor consisting of trimethylaluminum (TMA) under process conditions sufficient to react the aluminum precursor and provide a chemisorbed layer comprising a deposition temperature between about 250° C. and about 300° C.;
   c. purge to remove unreacted aluminum precursor;
   d. introducing into the reactor a first nitrogen source to react with at least a portion of the chemisorbed layer and provide at least one reactive site, the first nitrogen source consisting of hydrazine;
   e. purging the reactor with a purge gas;
   f. introducing into the reactor an organoaminosilane precursor consisting of di-sec-butylaminosilane;
   g. purging the reactor with a purge gas;
   h. introducing a second nitrogen source into the reactor to react with at least a portion of the chemisorbed layer and provide at least one reactive site, the second nitrogen source consisting of hydrazine; and
   i. optionally purge the reactor with an inert gas,
   wherein the steps do not include plasma enhancement and wherein steps b. through i. are repeated to produce conformal aluminum doped silicon nitride dielectric film.

2. A method for depositing a conformal aluminum doped silicon nitride dielectric film via thermal atomic layer deposition, the method consisting of the steps of:
   a. providing a substrate into a reactor;
   b. introducing into the reactor an aluminum precursor comprising trimethylaluminum (TMA) under process conditions sufficient to react the aluminum precursor and provide a chemisorbed layer comprising a deposition temperature of about 400° C. or less;
c. purge to remove unreacted metal precursor;
d. introducing into the reactor a first nitrogen source consisting of hydrazine ($N_2H_4$);
e. purging the reactor with a purge gas;
f. introducing into the reactor an organoaminosilane precursor consisting of di-sec-butylaminosilane (DSBAS);
g. purging the reactor with a purge gas;
h. introducing a second nitrogen source consisting of hydrazine ($N_2H_2$) into the reactor to react with at least a portion of the chemisorbed layer and provide at least one reactive site; and
i. optionally purge the reactor with an inert gas,
wherein steps b. through i. are repeated to create a supercycle, the supercycle defined by the formula: $x(yTMA+z[DSBAS+N_2H_4])$,
wherein x is an integer number of supercycles, y is an integer number of TMA exposures that occur before SiNx growth, and z is an integer number of ALD cycles of DSBAS and $N_2H_4$;
wherein the steps a.-i. do not include plasma enhancement and are performed to produce conformal aluminum doped silicon nitride dielectric film having a density of 2.2 to 3.0 g/cc.

3. The method of claim 2, wherein the deposition temperature is between about 250° C. and about 300° C.

4. The method of claim 2, wherein y is less than z.

5. The method of claim 2, wherein z is more than 10 times y.

* * * * *